United States Patent
Harrison et al.

(10) Patent No.: US 6,356,234 B1
(45) Date of Patent: Mar. 12, 2002

(54) ELECTRICAL CIRCUIT

(75) Inventors: David Harrison, Egham; Blue John Ramsey, Sunningdale; Peter Sidney Albert Evans, Egham, all of (GB)

(73) Assignee: R T Microwave Limited, Gourock (GB)

(*) Notice: Subject to any disclaimer, the term of this patent is extended or adjusted under 35 U.S.C. 154(b) by 0 days.

(21) Appl. No.: 09/202,388

(22) PCT Filed: Jun. 11, 1997

(86) PCT No.: PCT/GB97/01572

§ 371 Date: Apr. 5, 1999

§ 102(e) Date: Apr. 5, 1999

(87) PCT Pub. No.: WO97/48257

PCT Pub. Date: Dec. 18, 1997

(30) Foreign Application Priority Data

| Jun. 12, 1996 | (GB) | 9612272 |
| Sep. 26, 1996 | (GB) | 9620099 |
| Oct. 16, 1996 | (GB) | 9621571 |

(51) Int. Cl.$^7$ ................................. H01Q 1/38
(52) U.S. Cl. ................. 343/700 MS; 340/572
(58) Field of Search ................. 343/700 MS; 340/572; 524/313; 361/321.4; 156/630; 354/317; 174/52.4

(56) References Cited

U.S. PATENT DOCUMENTS

| 5,218,168 A | * 6/1993 | Mitchell et al. ............ 174/52.4 |
| 5,294,290 A | * 3/1994 | Reeb .......................... 156/630 |
| 5,381,137 A | * 1/1995 | Ghaem et al. ............... 340/572 |
| 5,398,092 A | * 3/1995 | Tanno et al. ................ 354/317 |
| 5,442,334 A | * 8/1995 | Gallo et al. ................. 340/572 |
| 5,675,345 A | * 10/1997 | Pozgay et al. ....... 343/700 MS |
| 5,844,523 A | * 12/1998 | Brennan et al. ..... 343/700 MS |
| 5,926,360 A | * 7/1999 | Laibowitz et al. ....... 361/321.4 |
| 5,948,843 A | * 9/1999 | Boutier et al. .............. 524/313 |

FOREIGN PATENT DOCUMENTS

| DE | 25 01 768 A | 7/1976 |
| EP | 0 140 585 A | 5/1985 |
| JP | 05 222326 A | 8/1993 |
| JP | 05 327185 A | 12/1993 |

OTHER PUBLICATIONS

D. Harrison et al, "Novel Circuit Fabrication Techniques for Reduced Environmental Impact", Oct. 9–11, 1995, Clean Electronics Products and Technology, Conference Publication No. 415.*

Patent Abstracts of Japan, Toshihiko et al, Publication No. 05222326, Aug. 31, 1993.*

D. Harrison et al., "Novel Circuit Fabrication Techniques for Reduced Environmental Impact", Concept—Clean Electronics Products and Technology, Oct. 9–11, 1995, Conference Publication No. 415, pp. 174–175.

* cited by examiner

*Primary Examiner*—Don Wong
*Assistant Examiner*—Hoang Nguyen
(74) *Attorney, Agent, or Firm*—Renner, Otto, Boisselle & Sklar, LLP

(57) ABSTRACT

An electrical circuit board is provided with a substrate, preferably of paper such as gloss art paper, bond paper or a semi-synthetic paper, and an electrical circuit lithographically printed onto the substrate from an ink comprising electrical particles suspended in a resin. The resin may be an organic resin such as an alkyd resin, and the conductive particles may be metallic silver. The manufacture of electrical components such as resistors and capacitors and antennae is also described. The circuit printing technique is reliable, cheap and can be based on a range of substrates not previously possible.

17 Claims, No Drawings

ELECTRICAL CIRCUIT

The present invention relates to in electrical circuit and a system for producing such a circuit.

Conventionally, to mount a silicon device a circuit board is prepared. This generally consists of etched copper on glass fibre laminate, tin plated and possibly carrying further layers of lacquer for protection and labelling. Many operations of cropping, drilling, etching and plating are involved in its preparation. It is not cheap, and the production processes can have significant environmental impact.

The two major environment hazards posed by PCB manufacture are the waste effluent which is acidic and contains heavy metals, (especially copper) and the use of hydrocarbons in photoresist developer and stripper. Stricter pollution limits imposed by water authorities are one driving force to reduce copper in effluent. In theory, waste effluent could be eliminated by a totally additive process for copper deposition, which would also offer considerable cost savings, but a satisfactory process has not yet been developed.

Attempts to avoid the use of a circuit board as such include the use of both thick and thin film techniques, normally associated with higher cost, not lower. Resistors are formed on a ceramic substrate by depositing tracks of a suitable film, sometimes trimmed to precise values by laser etching. A film of higher conductivity is generally used for interconnection.

The present invention seeks to provide an improved electrical circuit and a system for producing such a circuit.

The research leading to this invention was directed towards techniques to print circuit board designs directly onto suitable substrates. One application of this technique is in substitutes for conventional (copper-clad resin/laminate) circuit boards where for low complexity circuits, directly printed substrates offer cost advantages and environmental benefits. The lithographic printing process sought to be used for this invention was considered to offer potential advantages in speed, hardware availability, and a small ink volume per unit, which would translate into additional financial and environmental benefits when compared to traditional screen printing and etched copper-clad laminate practice.

The use of lithographic processes for the manufacture of electronic and electrical circuit systems, including electrical interconnects and electrical and electronic components. The term "lithographic process" referred to herein is a process for the printing of an electrically conductive film and passive components on a suitable substrate, utilizing differences in surface chemistry of the printing plate, including hydrophilic and hydrophobic properties. It does not refer to the commonly used process involving photoresist and etching occurring during the production of etched circuit boards and/or silicon semiconductor micro electronics. The term "ink" is intended to mean any material suitable for printing.

There are several important aspects of the developed lithographic circuit fabrication process, including:

A conductive ink

A lithographically printed circuit

Thus, according to an aspect of the present invention, there is provided an ink for the manufacture of an electrical circuit comprising electrically conductive particles suspended in a resin.

By ink it is intended to mean any liquid suitable for printing.

Preferably, the resin is an organic resin, such as an alkyd resin.

The conductive particles preferably consist of or include metallic silver. The metal content of the ink may be in-the range between 65% and 95% w/w, preferably between 650% and 90% w/w and most preferably about 80% w/w. The size of the metal particles may be in the range between 0.1 and 10 micrometres and preferably about 1 micrometre.

If aluminium or another conductive particulate is employed the w/w percentage will vary as the materials have differing densities, a metal coated particulate could be very light resulting in a low w/w percentage. A range of 15% or 20% w/w to 95% w/w is envisaged for these metals.

The ink preferably exhibits thixotropic flow properties of about 10.3 PaS @ 25° C.

According to another aspect of the present invention, there is provided an electrical circuit board including a substrate, an electrical circuit lithographically printed onto the substrate from an ink as specified herein.

The circuit board may include one or more electrical components and a conductive component fixative binding the or at least one circuit component to the electrical circuit.

The component fixative preferably includes a metal-loaded or conductive adhesive as herein specified.

The substrate may be a paper such as gloss art paper, bond paper or a semi-synthetic (for example polyester fibre) or synthetic papers (for example Polyart), or plastics (for example Polyethylene), or composite materials (for example FR4 or FR2).

An embodiment of the present invention is described below, by way of illustration only. For ease of understanding, this embodiment is described by way of its component parts.

The Ink

Ink layers deposited by the preferred lithographic printing process are about 5 micrometres ($5 \times 10^{-6}$ m) thick. This may be compared to about 25 micrometres for conductive layers deposited by screen printing, and 35–75 micrometres of copper typically laminated onto a conventional printed circuit board. The ink must therefore exhibit a high electrical conductivity, and yet conform to the mechanical constraints imposed by the lithographic printing process.

The adopted approach has been to formulate an ink from electrically conductive particles suspended in an organic (e.g. alkyd) resin. Although this resin is non-conductive, it acts as a vehicle for the conductive particles, and partly determines the mechanical properties of the ink. Manipulation of the resin formulation permits a degree of control over certain mechanical characteristics of the ink (e.g. viscosity). Metallic conductors, and elements falling in group IV of the periodic table, have been employed as the conductive particulate.

When printed lithographically, the resulting ink films consist of a "pebble dash" of conductive particles distributed on the substrate surface. The electrical resistance of the ink film on the macroscopic scale is considered to be dependent on the physical distribution of the conductive particles on the substrate, and on the physical contact between them.

For the printing of electrical circuits, a variety of materials may be used to formulate suitable inks. Suitable materials selected for their characteristic conductivity and chemical stability include silver powder, silver coated particles, titanium oxide, palladium, gold, allotropes of carbon or alloys or mixtures of the above-mentioned materials and other suitable conductive materials. It is considered that the mean optimal metal particle size lies in the range 0.1 to 10 micrometres.

An organic phase as a binder mixed with the conductive material. Suitable constituents of the organic phase include a resin such as an alkyd resin, phenolic resin, hydrocarbon resin, turpene resin and rosin, suitable hydrocarbon solvents and other suitable additives used to adjust the printing, conductivity, wear resistance and is drying properties of the printed layer.

The conductivity within the deposited ink film is therefore affected by:

Particle size and shape

Particle to resin ratio

Resin composition

The preferred ink formulation contains a high proportion (approximately 80% w/w) of metallic silver, with a mean particle size $\leq 1$ micrometre.

Work to date has demonstrated that standard lithographic printing technology can be adapted to electronic circuit fabrication for which we have developed a conductive ink formulation with adequate mechanical and electrical properties. The preferred ink incorporates:

Nodular silver particles whose mean particle size is less than about 1 micrometre ($10^{-6}$ m). The resulting ink formulation exhibits thixotropic flow properties about (10.3PaS @ 25° C.). It is considered that the mean optimal metal particle size lies in the range 0.1–10 micrometres.

The metal content of this ink is preferably about 800%. w/w. The optimal metal loading for this ink is considered to lie in the range 65% to 95% w/w, preferably between 65% and 90% w/w.

If aluminium or another conductive particulate is employed the w/w percentage will vary as the materials have differing densities, a metal coated particulate could be very light resulting in a low w/w percentage. A range of 15% or 20% w/w to 95% w/w is envisaged for these metals.

The range of particle sizes present in the ink is considered to influence film conductivity, and that a combination of particle sizes provides a higher probability of interparticle contact, with smaller particles filling voids between larger particles. The ink formulation when printed has been found to yield a sufficiently low sheet resistivity for many circuit applications.

An example formulation of a conductive ink is:

| | |
|---|---|
| Silver powder particulate possessing a mean particle size of 5.5 micrometres | 80% by weight |
| Hydrocarbon resin containing a styrenated alkyd | 16% by weight |
| High boiling point solvent with about 24% aromatic content | 3.5% by weight |
| Antioxidant | 0.5% by weight |

The resulting ink formulation exhibits thixotropic flow properties, exhibiting a viscosity of about $10^4$mPaS @ 25 degrees C. Suitable viscosities of ink formulations are considered to lie within $10^3$mPaS @ 25 degrees C. and $10^5$mPaS @ 25 degrees C.

It has been demonstrated that standard lithographic printing technology can be adapted to electrical circuit fabrication for which we have developed a conductive ink formulation with adequate mechanical and electrical properties.

The Substrate

FR4 and FR2 circuit board substrates in widespread use are glass fibre and paper materials impregnated with epoxy resins and other additives such as fire retardants and fungicides. The preferred lithographic process requires the substrate to be both flexible and have a degree of affinity towards the printed ink.

Substrate considerations for successful circuit fabrication include:

Substrate surface topography

Material properties

Substrate topography influences the quantity of ink laid down and whether the particles of conductor are likely to be in contact with their neighbours.

The material properties of the substrate that must be considered include moisture resistance, dielectric properties, flame retardancy, temperature cycling and mechanical strength.

Trials have included Gloss art, bond, synthetic papers, plastics and composite substrates. Many of these can have surface coatings or treatments applied to enhance particular characteristics. The conductivity of the deposited films is dependent upon the surface characteristics of the substrate and the ink. Similar conductivities are achievable across a range of substrates, enabling substrates to be selected for other characteristics, such as cost, flexibility and weight.

It is envisaged that paper substrates could be coated or impregnated with conformal agents (e.g. waterproofing compounds or fire retardants) in certain circumstances.

The component fixative:

Work has focused on conductive adhesives that are used in many applications and are generally available. We have assembled examples of lithographically printed circuits on gloss art paper substrates using a commercially available silver-loaded epoxy as a bonding cement between the ink film and component terminations.

Printing trials have yielded ink films deposited onto paper substrates which have acceptable electrical characteristics and which have subsequently been assembled into functional electronic systems.

There follow various examples of specific features of the printed circuit and of various applications.

Lithographically printed passive electrical components

It is possible by lithographic printing to provide passive electrical components, including resistors, capacitors and inductors. The components are formed by a composition from a range of materials which form lithographic inks, which include conductive and or resistive and or dielectric material and an organic phase comprised of a resin, solvent and additives to make a paste-like composition.

Heretofore known processes and materials for passive components for electronic circuits apply to prior known methods of electronic circuit fabrication, for example a through-hole, surface mount or screen printed components, not to the lithographic process, or lithographic ink, or material used to create lithographically deposited passive components.

Resistive components can be formed by films of electrically conducting particles and a binder for retaining the conductive/resistive particles in an oriented relation. Capacitive components can be formed by films composed of resins, particulates and additives exhibiting suitable dielectric properties.

For the printing of resistors, a variety of materials may be used, selected for their characteristic conductivity/ resistivity. For example, a blend of silver flake and carbon black may be used with the proportion of silver to carbon varied to provide the desired resistivity. Other suitable materials include silver powder, silver coated particles, titanium oxide, tin oxide, allotropes of carbon and other suitable conductive and resistive materials. An organic phase as a binder is mixed with the conductive material. Suitable constituents of the organic phase include a resin such as an alkyd resin, phenolic resin, hydrocarbon resin, turpene resin and rosin, suitable hydrocarbon solvents and other suitable additives used to adjust the printing and drying properties of the printed layer.

In order to achieve a range of resistances, a combination of parameters are exploited. First, a range of lithographic inks is prepared which exhibit sheet resistivities differing by several orders of magnitude when lithographically printed. To achieve the desired resistance, the ink with the closest sheet resistivity to the target resistance is used. The desired value is then achieved through the geometry of the printed resistor. This allows several inks to cover the entire range of commonly available resistor values. For example, three inks with sheet resistivities of 100; 10000 and 1000000 ohms per square are suitable for fabricating resistors with values between 10 ohm and 10 Mohm.

An example of resistive ink formulation may be as follows:

| | |
|---|---|
| Graphite powder possessing a mean particle size of = 3.5 micrometres | 31.5% by weight |
| Hydrocarbon resin containing a styrenated alkyd | 53.5% by weight |
| High boiling point solvent with about 24% aromatic content | 13.5% by weight |
| Antioxidant | 1.5% by weight |

Capacitors can be formed by printing one layer of conductive material, overprinting with an insulating ink to form the dielectric layer, then printing a further conductive layer to form the second conducting plate of the capacitor. The lithographic ink used to form the dielectric layer may be a composition which includes a resin such as an alkyd resin, phenolic resin, hydrocarbon resin, turpene resin and rosin, suitable dielectric material in particulate form, for example barium titanate, or other additives used to adjust the dielectric properties of the material, suitable hydrocarbon solvents and other suitable additives used to adjust the dielectric, printing and drying properties of the printed layer.

In order to produce a range of capacitances, a combination of parameters are exploited. First, a range of lithographic inks is prepared which exhibit dielectric properties of different orders of magnitude when printed. To achieve the desired capacitance, the ink with the most suitable dielectric properties is selected. The desired capacitance is then achieved through the geometry of the printed capacitor, varying the surface area of the plates and the thickness of the dielectric layer. This allows only a few inks to cover the range of commonly available capacitors.

The conductive elements of the capacitors utilize the lithographic ink developed to deposit electrically conductive films.

An example formulation of an ink which can be utilized as the dielectric layer in a lithographically printed capacitor is as follows:

| | |
|---|---|
| Hydrocarbon resin containing a styrenated alkyd | 76.7% by weight |
| High boiling point solvent with about 24% aromatic content | 12.8% by weight |
| Drying agent | 0.5% by weight |
| Tack reducing agent | 10% by weight |

Additives to enhance selected characteristics can be included during the ink manufacture to alter the printing, wear resistance, drying and electrical properties of the printed film of both the resistive and dielectric inks. As mentioned hereinabove, the passive components are formed of materials that are distinctly different from prior art and electronic materials.

Still another feature provides for the printing of the components on a variety of substrates, namely the same types of material substrates aforementioned as suitable for the lithographic printing of conductive inks, including preferably a cellulose or synthetic polymer based paper, plastics and composites. The type of material from which the substrate would be selected would depend on the manner of use of the circuit board, and the environment in which it would be used.

In the mixing of the printed material that comprises part of the composition, relative percentages of the materials described above and which are used in the composition are disclosed above. A possible manufacture process for all the conductive, resistive, dielectric and insulating inks is as disclosed. The constituent materials can be mixed until a smooth paste is achieved where upon the paste can be milled (for example with a cone or roll mill) several times, incrementally reducing the mill gap width to 1 micron. A "50% break Fineness of Grind" test result should preferably lie within 7.5 microns and 0 microns, more preferably between 3 microns and 0 microns and ideally between 1 micron and 0 microns.

Note: whilst the ink for printing capacitors contains no conductive/resistive material it is of a different composition to the resin phase of the resistor or conductor ink.

More generally, resistors and capacitors may be made of the following consituents:

| Material | % by weight | Resistors | Capacitors |
|---|---|---|---|
| Dielectric/Conductive/resistive material | | 0–85 | 0–85 |

The remaining percentage weight is made up of resin phase and additives.

Lithographically Printed Antenna

One of the applications of this technology is in the fabrication of Microwave Structures using Lithographic Printing Processes.

The lithographic printing process may be used to print microwave stripline structures directly onto flexible substrates. The application of this work is in microwave integrated circuits (MICs), and in microwave antenna design. Stripline patterns can be printed directly onto flexible substrates which can then be mounted onto planar surfaces to form the stripline elements of microwave integrated circuits (MICs), or planar antenna structures, or to contoured surfaces to form 3-dimensional antenna structures.

A lithographically printed microwave antenna may be fabricated by lithographic printing, the antenna being formed by a composition of materials, which form a lithographic ink as aforementioned, include a conductive material mixed with a resin, solvent and additives to make a paste-like composition as disclosed herein above in the Ink section. The aforementioned ink is adhered to a substrate in an antenna configuration. Printed antennae described in the prior known systems are printed using alternative thick film methods, for example via a screen printing process, not via a lithographic printing process or lithographic printing ink.

One embodiment provides a lithographically printed microwave antenna. The antenna includes a dielectric substrate, a stripline structure having electrical properties being imprinted on the surface of the substrate. The antenna structure is formed of electrically conductive particles and a binder for retaining the conductive particles in an oriented relation, thereby providing for electrical conductivity through the antenna. A unique feature of the antenna is that its material composition is suitable for deposition using the lithographic printing process. This method by which the antenna is formed, permits the antenna to be fabricated in a simple and inexpensive manner.

It is contemplated that the substrate on which the antenna is printed will be formed of a dielectric material having non-conductive characteristics, preferably a cellulose or synthetic polymer based paper, but plastic substrates such as Mylar (TM) may also be used. The kind of material from which the substrate would be selected would depend on the manner of use of the antenna, and the environment in which it would be used.

As mentioned hereinabove, the antenna is formed from, and tuned by selection of constituents of, a composition that includes particles of conductive material, such as silver powder, silver flake, palladium particulate, platinum powder, carbon black, and other suitable conductive materials. The ink includes a binder such as a resin mixed with the conductive material. A suitable resin for binding the conductive material may be an alkyd or rosin or other suitable materials. The ink formulation when printed, yields an acceptably low sheet resistivity for many microwave circuit applications.

In the mixing of the printed material for an antenna, relative percentages of the materials used in the composition may be as follows:

| Materials | Percent by weight |
|---|---|
| Conductive material | 15–85 |
| Organic phase | 85–15 |

This ink formulation when printed, yields an acceptably low sheet resistivity for many microwave circuit applications.

The disclosures in U.K. patent application no. 9612272.6, from which this application claims priority, and in the abstract accompanying this application are incorporated herein by reference.

What is claimed is:

1. A microwave stripline structure lithographically printed onto a flexible, dielectric substrate with an ink comprising electrically conductive particles suspended in a resin.

2. A microwave integrated circuit comprising a microwave stripline structure according to claim 1, wherein said dielectric, flexible substrate is mounted on a planar surface.

3. A microwave antenna comprising a microwave stripline structure according to claim 1, wherein said stripline structure is arranged to form an antenna configuration on said substrate.

4. A microwave antenna according to claim 3, wherein said flexible substrate is arranged to form a 3-dimensional antenna structure.

5. A microwave antenna according to claim 4, wherein said flexible substrate is mounted on a contoured surface to form said 3-dimensional antenna structure.

6. A microwave device according to claim 1, wherein said flexible substrate is a plastic Mylar (TM) substrate.

7. A microwave device according to claim 1, wherein said conductive particles comprise at least one of the following materials: silver powder, silver flake, palladium particles, platinum particles and carbon black.

8. A structure, assembly or device according to claim 1, wherein said substrate is a cellulose based paper.

9. A structure, assembly or device according to claim 1, wherein said substrate is a synthetic polymer based paper.

10. A structure, assembly or device according to claim 1, wherein said ink comprises 15–85% by weight of particulate conductive or dielectric material.

11. A structure, assembly or device according to claim 1, wherein said resin is an alkyd resin.

12. An electrical assembly comprising at least one passive electrical component lithographically printed onto a substrate, from at least one ink comprising electrically conductive particles suspended in a resin, wherein said at least one printed passive electrical component is printed to form a resistive, capacitive and/or inductive formation and the conductive particles of the at least one ink are selected from at least one of the following: silver flake, silver powder, silver coated particles, titanium dioxide, tin oxide, carbon black and other allotropes of carbon.

13. An electrical assembly according to claim 12, wherein said conductive particles in said ink comprise a mixture of silver flake and carbon black.

14. An electrical assembly according to claim 12, wherein said at least one passive electrical component is a capacitor comprising a lithographically printed conductive layer, over-printed with a dielectric layer and covered by a further printed conductive layer.

15. An electrical assembly according to claim 14, wherein said dielectric layer is printed with an insulating ink comprising a resin and a dielectric material in particulate form.

16. An electrical assembly according to claim 15, wherein said particulate dielectric material is barium titanate.

17. An antenna comprising a stripline structure lithographically printed onto a flexible, dielectric substitute with an ink comprising electrically conductive particles suspended in a resin, wherein said stripline structure is arranged to form an antenna configuration on said substrate.

* * * * *